(12) United States Patent
Kappauf et al.

(10) Patent No.: US 11,832,425 B2
(45) Date of Patent: Nov. 28, 2023

(54) SUPPORT FOR ELECTRIC COMPONENTS

(71) Applicant: Siemens Aktiengesellschaft, Munich (DE)

(72) Inventors: Daniel Kappauf, Bayern (DE); Lutz Namyslo, Hausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/763,377

(22) PCT Filed: Aug. 21, 2020

(86) PCT No.: PCT/EP2020/073471
§ 371 (c)(1),
(2) Date: Mar. 24, 2022

(87) PCT Pub. No.: WO2021/058212
PCT Pub. Date: Apr. 1, 2021

(65) Prior Publication Data
US 2022/0361360 A1 Nov. 10, 2022

(30) Foreign Application Priority Data
Sep. 25, 2019 (EP) .................................... 19199594

(51) Int. Cl.
*H05K 7/20* (2006.01)
(52) U.S. Cl.
CPC ......... *H05K 7/209* (2013.01); *H05K 7/20409* (2013.01)
(58) Field of Classification Search
None
See application file for complete search history.

(56) References Cited

U.S. PATENT DOCUMENTS

| 5,131,456 A | 7/1992 | Wu |
| 5,138,521 A | 8/1992 | Watanabe et al. |

(Continued)

FOREIGN PATENT DOCUMENTS

| CN | 107249275 A | 10/2017 |
| EP | 1753025 A2 | 2/2007 |
| WO | WO 2014132424 A1 | 9/2014 |

OTHER PUBLICATIONS

PCT International Search Report and Written Opinion of International Searching Authority dated Nov. 26, 2020 corresponding to PCT International Application No. PCT/EP2020/073471 filed Aug. 21, 2020.

*Primary Examiner* — Courtney L Smith
(74) *Attorney, Agent, or Firm* — Henry M. Feiereisen LLC

(57) ABSTRACT

A support for at least one electrical component includes a heat sink having a heat sink surface and two opposing lateral walls protruding from the heat sink surface. The heat sink includes a base body made of aluminum and a copper layer as a heat spreading layer which forms the heat sink surface. The copper layer is produced together with the base body through continuous casting, or with the copper layer being applied additively through cold gas spraying to a surface of the base body. Two spaced-apart sealing blocks lie on the heat sink surface, with each of the two sealing blocks extending between the two lateral walls and contacting the two lateral walls. A support structure is arranged on the heat sink surface between the two sealing blocks.

18 Claims, 4 Drawing Sheets

(56) References Cited

U.S. PATENT DOCUMENTS

| | | | | |
|---|---|---|---|---|
| 5,610,799 A | * | 3/1997 | Kato | H05K 5/0091 |
| | | | | 361/752 |
| 6,914,321 B2 | * | 7/2005 | Shinohara | H01L 24/49 |
| | | | | 257/691 |
| 9,041,196 B2 | * | 5/2015 | Bayerer | H05K 1/141 |
| | | | | 257/E23.083 |
| 9,730,362 B2 | | 8/2017 | Chen | |
| 9,736,943 B2 | * | 8/2017 | Taya | H05K 1/181 |
| 9,848,518 B2 | * | 12/2017 | Yuan | H05K 7/209 |
| 9,986,631 B2 | * | 5/2018 | Rizza | H01L 23/49833 |
| 10,720,368 B2 | * | 7/2020 | Harada | H01L 21/52 |
| 10,959,333 B2 | * | 3/2021 | Inoue | H01L 23/047 |
| 2007/0134951 A1 | | 6/2007 | Inagaki et al. | |
| 2008/0237847 A1 | * | 10/2008 | Nakanishi | F28F 3/12 |
| | | | | 257/722 |
| 2010/0089620 A1 | | 4/2010 | Matz | |
| 2010/0091461 A1 | | 4/2010 | Yamanaka | |
| 2014/0029201 A1 | | 1/2014 | Chae et al. | |
| 2016/0181175 A1 | * | 6/2016 | Ikeda | H01L 23/42 |
| | | | | 438/109 |
| 2019/0103334 A1 | * | 4/2019 | Tanaka | H01L 23/293 |

* cited by examiner

SUPPORT FOR ELECTRIC COMPONENTS

CROSS-REFERENCES TO RELATED APPLICATIONS

This application is the U.S. National Stage of International Application No. PCT/EP2020/073471, filed Aug. 21, 2020, which designated the United States and has been published as International Publication No. WO 2021/058212 A1 and which claims the priority of European Patent Application, Serial No. 19199594.3, filed Sep. 25, 2019, pursuant to 35 U.S.C. 119(a)-(d).

BACKGROUND OF THE INVENTION

The invention relates to a support for at least one electrical component, a method for producing such a support and an electronics module.

The manufacturing of electronics modules with power semiconductors such as IGBTs (Insulated-gate bipolar transistors) or MOSFETs (metal-oxide-semiconductor field-effect transistors) is complicated and expensive. In order to meet the high insulation requirements for such electronics modules, the semiconductor chips and bonding wires are covered with a casting compound, for example, a silicon-based soft casting compound. The casting compound also prevents the penetration of moisture and corrosion of the parts. During casting, the casting compound is very thin. In order to achieve good wetting and to avoid the formation of bubbles, the casting is carried out with a low negative pressure. A module housing prevents the casting compound from flowing out during the casting process and the curing phase. For this purpose, the module housing must have a high degree of impermeability both internally and in relation to a base plate of the electronics module. Therefore, the module housing parts are connected to one another and to the base plate by a highly elastic adhesive. The adhesive process and soft casting require a plurality of heating processes for pre-drying and curing of the adhesive and the casting compound which bring about high manufacturing process times. Furthermore, the development of a module housing requires a relatively high development effort. In addition, high investment costs arise for injection molding tools and a machine for automatic pin assembly of the electronics modules. The development of tools for the production of the base plate also requires a plurality of iteration loops.

The object of the invention is to simplify the manufacturing of electronics modules, in particular of electronics modules with power semiconductors, and to reduce their costs.

SUMMARY OF THE INVENTION

The object is achieved according to the invention by a support for at least one electrical component as set forth hereinafter, by a method for producing such a support as set forth hereinafter, and by an electronics module as set forth hereinafter.

Advantageous embodiments of the invention are the subject matter of subclaims.

A support according to the invention for at least one electrical component comprises a heat sink having a heat sink surface and two opposing lateral walls protruding from the heat sink surface, two spaced-apart sealing blocks lying on the heat sink surface, each extending between the two lateral walls and being in contact with each of the two lateral walls, and a support structure for the at least one electrical component arranged on the heat sink surface between the two sealing blocks.

A support according to the invention serves to reduce the complexity of electronics modules by functions of parts of conventional electronics modules being assumed by the support and thereby saving or simplifying parts. As a result, the manufacturing of an electronics module is simplified, and the costs of manufacturing are reduced. In particular, the invention enables the manufacturing of an electronics module with power semiconductors without a complex module housing, which prevents the casting compound for insulating the power semiconductors from flowing out. The function of the module housing is assumed by the lateral walls and the sealing blocks of the support according to the invention, which prevent the casting compound from flowing out prior to curing thereof. In particular, this eliminates the need to seal a module housing using a complex and lengthy process with an adhesive tailored to the materials used. Furthermore, a base plate for the electronics module is no longer required as its function is assumed by the heat sink. The support structure arranged directly on the heat sink surface enables improved cooling of electrical components arranged on the support structure and thereby enables a higher load-bearing capacity of the electrical components and/or an extended service life of the electrical components.

In one embodiment of the invention, the heat sink has a base body and a heat spreading layer, for example, a copper layer, forming the heat sink surface. The heat spreading layer arranged between the base body and the support structure further improves the cooling of the electrical components arranged on the support structure.

In a further embodiment of the invention, the base body is manufactured from aluminum, wherein the heat spreading layer is designed as a copper layer and wherein the copper layer is produced together with the base body by means of continuous casting or wherein the copper layer is applied additively, in particular, by means of cold gas spraying, to the base body surface (23). Aluminum is suitable as a material for the base body due to its high thermal conductivity and relatively low costs. By virtue of the higher thermal conductivity of the copper layer, in particular compared to aluminum, the cooling of the electrical components arranged on the support structure is further improved. A Joint production of the copper layer with the base body by means of continuous casting is cost-effective. The additive application of the copper layer, in particular by means of cold gas spraying, produces a material connection between the copper layer and the heat sink, which leads to improved heat transfer.

In a further embodiment of the invention, each sealing block can be non-positively connected to the heat sink by at least one screw connection. This enables simple assembly and flexible positioning of the sealing blocks.

In a further embodiment of the invention, each sealing block is positively connected to the heat sink by at least one tongue-and-groove connection. The sealing function preventing the leakage of casting compound from the sealing blocks can be advantageously improved by tongue-and-groove connections.

In a further embodiment of the invention, at least one electrically conductive connection lug for an electrical power connection is arranged on at least one sealing block. As a result, in addition to its sealing function, a sealing block can also fulfill a support function for at least one electrical power connection for supplying the electrical components with direct or alternating current.

In a further embodiment of the invention, the sealing blocks are manufactured from plastic. This advantageously enables the simple and cost-effective production of the sealing blocks, for example, by means of injection molding with a simple injection molding tool.

In a further embodiment, at least one of the sealing blocks on a side facing the heat sink surface has a bead in which a sealing apparatus is arranged. For example, the bead is a segmented cylindrical recess which, in particular, runs orthogonally to the lateral walls of the heat sink. In particular, the sealing apparatus is compressed in the region of the bead so that an improved sealing function of the at least one sealing block is achieved.

In a further embodiment, the sealing apparatus has an adhesive connection with the heat sink surface and/or with the at least one sealing block. Such a sealing apparatus is, for example, designed as an adhesive bead, the adhesive connection resulting in a further improvement of the sealing function.

In a further embodiment of the invention, the support structure has a ceramic substrate coated with a copper structure remote to the heat sink surface. The support structure is thus a so-called DCB structure (DCB=direct bonded copper) with a copper structure for the electrical connection, application and cooling of electrical components arranged on the support structure.

In a further embodiment of the invention, the support has connection contacts arranged on the support structure which protrude from the support structure remote to the heat sink surface. This enables electrical components arranged on the support structure to be contacted via the connection contacts, for example, in order to control electric components. The direct positioning of the connection contacts on the support structure does away with the need for a separate machine for automatic pin assembly, which requires high investment costs. The connection contacts can be placed by means of an automatic placement machine (a so-called pick-and-place machine). The direct positioning of the connection contacts on the support structure (and not, for instance, on the edge of the module) also advantageously shortens the bonding wire connections and thus reduces parasitic inductances and resistances, which has an advantageous effect on the switching overvoltage and the electromagnetic compatibility of the circuit arrangement.

In a further development of the aforementioned embodiment of the invention, the support has a cover which can be detachably connected to the heat sink, for example, by at least one latching connection and/or at least one screw connection and has cover openings for the connection contacts in order to stabilize the connection contacts. The cover only serves to stabilize the connection contacts against lateral buckling and thus holds the connection contacts in their position. In particular, the cover does not have a sealing function and is therefore a part which can be easily produced and assembled.

In the method according to the invention for producing a support according to the invention, the heat sink is produced by means of continuous casting or by means of continuous casting with subsequent additive application of a heat spreading layer forming the heat sink surface, the sealing blocks are produced by means of injection molding, and the support structure is applied to the heat sink surface by means of soldering or sintering. The method according to the invention advantageously enables simple and cost-effective production of a support according to the invention.

An electronics module according to the invention comprises a support according to the invention, at least one electrical component arranged on the support structure of the support and a casting compound, for example, a silicon-based soft casting compound, which covers the support structure and the at least one electrical component. For example, at least one electrical component can be a power semiconductor component, in particular an IGBT or MOSFET. As an electronics module according to the invention has a support according to the invention for the electrical components of the electronics module, the advantages of an electronics module according to the invention correspond to the aforementioned advantages of a support according to the invention.

In a further embodiment of the invention, the electronics module comprises a cooling beam which has recesses for receiving cooling fins of the heat sink, the heat sink being connected via the cooling fins to the recesses of the cooling beam. Such an arrangement leads to an extension of the heat sink which improves cooling of the electrical components arranged on the support structure. As the electronics module is initially processed without the cooling beam, for example when soldering in a soldering oven, a thermal mass of the part to be soldered is reduced, leading to time and cost savings during the production process.

BRIEF DESCRIPTION OF THE DRAWING

The properties, features and advantages of this invention described above and the manner in which they are achieved will become clearer and more clearly understandable in connection with the following description of exemplary embodiments, which are explained in more detail in connection with the drawings, in which.

DETAILED DESCRIPTION OF PREFERRED EMBODIMENTS

Figure 1:
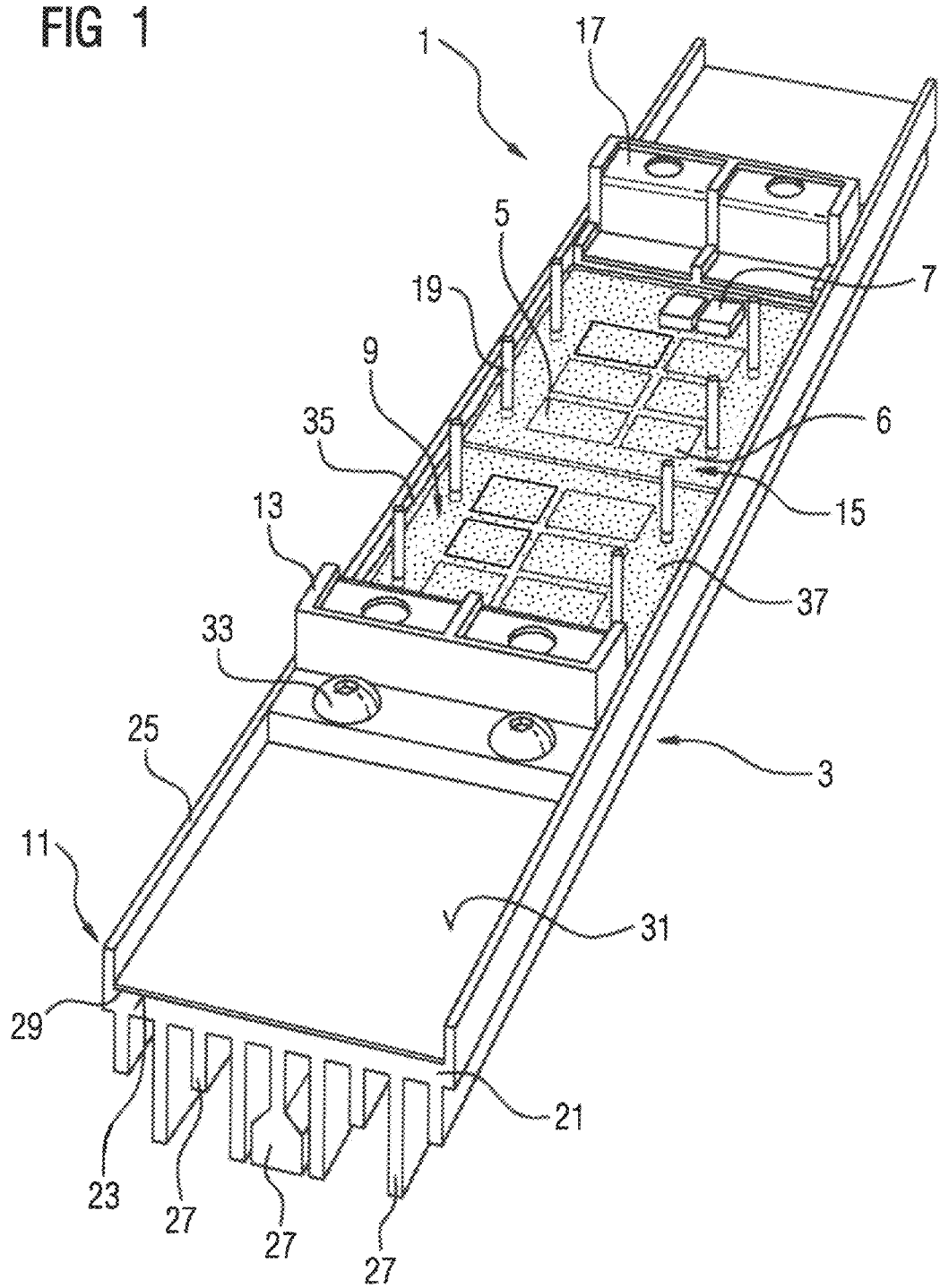
FIG. 1 shows a perspective representation of a first exemplary embodiment of an electronics module without a cover.

Corresponding parts are provided with the same reference characters in the figures.

Figure 2:
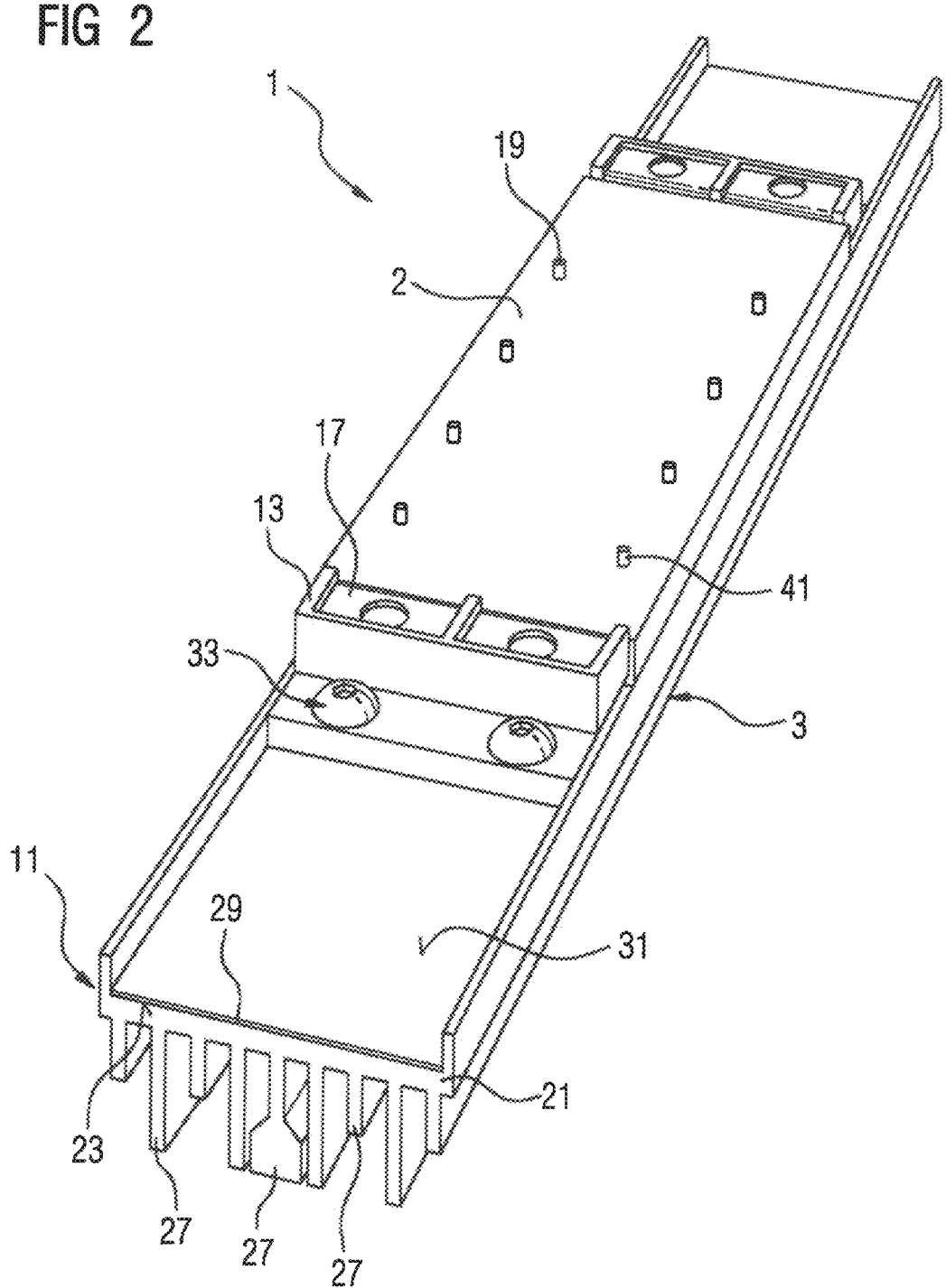
FIG. 2 shows a perspective representation of the electronics module with a cover shown in FIG. 1.

FIGS. 1 and 2 (FIG. 1 and FIG. 2) each show a perspective representation of a first exemplary embodiment of an electronics module 1 according to the invention. FIG. 1 shows the electronics module 1 without a cover 2 and FIG. 2 shows the electronics module 1 with a cover 2. The electronics module 1 comprises a support 3 according to the invention, electric components 5 to 7 and a casting compound 9.

The support 3 comprises the cover 2, a heat sink 11, two sealing blocks 13, a support structure 15, connection lugs 17 and pin-shaped connection contacts 19.

Figure 3:
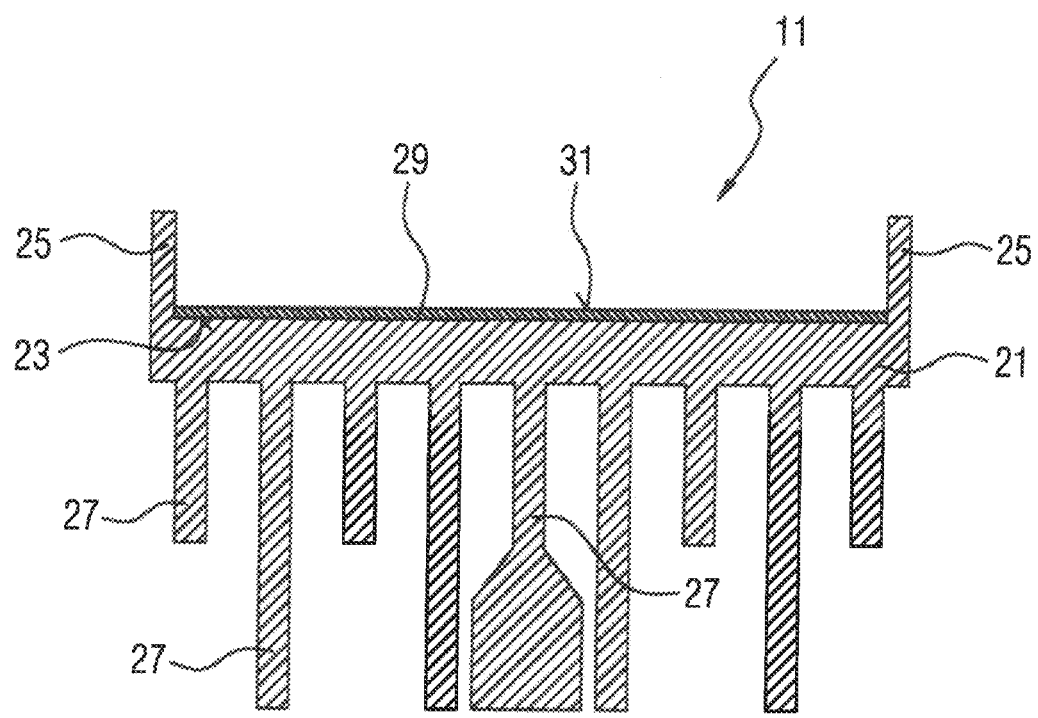
FIG. 3 shows a sectional representation of the heat sink of the electronics module shown in FIG. 1.

FIG. 3 (FIG. 3) shows a sectional representation of the heat sink 11. The heat sink 11 has a base body 21 which has a planar base body surface 23 on the upper side and two opposing lateral walls 25 protruding from the base body surface 23, and on the underside a plurality of cooling fins 27. The base body surface 23 is coated with a heat spreading layer 29 which forms a planar heat sink surface 31. For example, the base body 21 is produced from aluminum by means of continuous casting. The heat spreading layer 29 is, for example, a copper layer which is produced, for example, together with the base body 21 by means of continuous casting or is applied additively to the base body surface 23, for example, by means of cold gas spraying. In the exemplary embodiment shown, the lateral walls 25 are perpendicular to the base body surface 23. In other exemplary embodiments, the lateral walls 25 may protrude obliquely from the base body surface 23 and/or the lateral walls 25 may form a rounded profile with the base body surface 23 in the transition areas between the lateral walls 25 and the base body surface 23.

The two sealing blocks 13 are arranged at a distance from one another on the heat sink surface 31, each extend between the two lateral walls 25 and are in sealing contact with each of the two lateral walls 25 and the heat sink surface 31. Each sealing block 13 is non-positively connected to the heat sink 11 by two screw connections 33. In addition, each sealing block 13 can be positively connected to the heat sink 11 by at least one tongue-and-groove connection (not shown). For example, the sealing blocks 13 are manufactured from plastic by injection molding.

The support structure 15 is arranged on the heat sink surface 31 between the two sealing blocks 13. The support structure 15 has a ceramic substrate 35 lying on the heat sink surface 31, whose side facing away from the heat sink surface 31 is coated with a copper structure 37 which forms conductor tracks and contact surfaces for electrically connecting, applying and cooling the electrical components 5 to 7 and the connection contacts 19. The support structure 15 is a so-called DCB structure with the ceramic substrate 35 as the DCB substrate. The support structure 15 is applied to the heat sink surface 31 by means of soldering or sintering.

The connection lugs 17 form power connections of the electronics module 1 for supplying the electrical components 5 to 7 with direct current and/or alternating current. Each connection lug 17 is arranged on a sealing block 13 and is designed in a step-like manner. In alternative exemplary embodiments, the connection lugs 17 can also be omitted and the power connections formed by pin-shaped connection contacts 19, in particular when relatively low currents (for example, with current strengths below 100 A) flow via the power connections.

The connection contacts 19 comprise, for example, control connections for controlling electrical components 5 to 7. The connection contacts 19 are arranged on a side of the support structure 15 facing away from the heat sink surface 31 and are connected to the copper structure 37 of the support structure 15, for example, by ultrasonic welding or soldering. In other exemplary embodiments, planar connection contacts 19 can be provided instead of pin-shaped connection contacts 19.

The cover 2 is detachably connected to the heat sink 11, for example, via latching connections 39 (see FIG. 4) and/or via screw connections. The cover 2 has cover openings 41 for the connection contacts 19. Each connection contact 19 is guided through a cover opening 41 which stabilizes the connection contact 19 by preventing lateral bending of the connection contact 19 and thus holding the connection contact 19 in its position. The cover 2 is an optional component of the support 3 and serves only to stabilize the connection contacts 19. The cover 2 can therefore be omitted, in particular in exemplary embodiments with planar instead of pin-shaped connection contacts 19.

The electrical components 5 to 7 are arranged on the support structure 15. Electrical components 5 to 7 can be, for example, power semiconductor components such as an IGBT or MOSFET.

The casting compound 9 is, for example, a silicon-based soft casting compound and covers the electrical components 5 to 7 and the support structure 15. The lateral walls 25 and the sealing blocks 13 prevent liquid casting compound 9 from flowing out after application to the electrical components 5 to 7 and the support structure 15 before curing of the casting compound 9.

Figure 4:
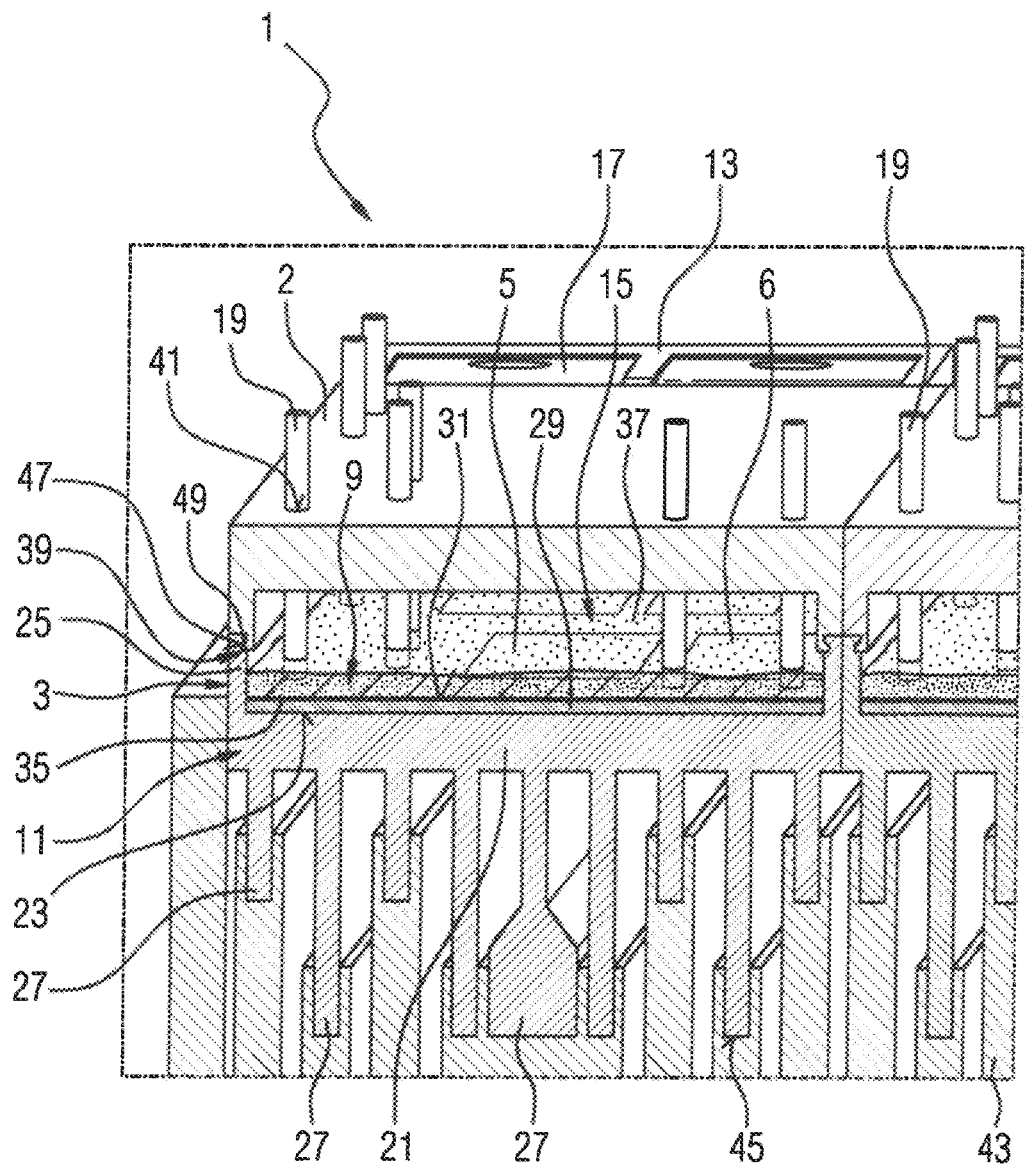
FIG. 4 shows a perspective sectional representation of two electronics modules according to a second exemplary embodiment.

FIG. 4 (FIG. 4) shows a perspective sectional representation of two electronics modules 1 according to a second exemplary embodiment. The electronics modules 1 are arranged next to one another over a cooling beam 43 which has recesses 45 for the cooling fins 27 of the heat sinks 11 of the electronics modules 1. The electronics modules 1 differ from the electronics module 1 shown in FIGS. 1 and 2 only in the arrangement of electrical components 5 to 7 and connection contacts 19 and the formation of the copper structure 37. FIG. 4 shows the embodiment of latching connections 39 for connecting the cover 2 to the heat sink 11 of an electronics module 1. Each latching connection 39 is formed by a latching groove 47 in a lateral wall 25 and a latching spring 49 of the cover 2 engaging in the latching groove 47.

Although the invention has been illustrated and described in detail by preferred exemplary embodiments, the invention is not limited by the disclosed examples and other variations may be derived therefrom by a person skilled in the art without departing from the scope of the invention.

The invention claimed is:

1. A support for at least one electrical component, said support comprising:
    a heat sink including a heat sink surface and two opposing lateral walls protruding from the heat sink surface, said heat sink including a base body made of aluminum and a copper layer as a heat spreading layer which forms the heat sink surface, with the copper layer being produced together with the base body through continuous casting, or with the copper layer being applied additively through cold gas spraying to a surface of the base body,
    two spaced-apart sealing blocks lying on the heat sink surface, with each of the two sealing blocks extending between the two lateral walls and contacting the two lateral walls and with at least one of the two sealing blocks including a bead on a side facing the heat sink surface;
    a support structure arranged on the heat sink surface between the two sealing blocks, and
    a sealing apparatus arranged in the bead.

2. The support of claim 1, wherein each of the two sealing blocks is positively connected to the heat sink by a tongue-and-groove connection.

3. The support of claim 1, further comprising an electrically conductive connection lug arranged on at least one of the two sealing blocks for an electrical power connection.

4. The support of claim 1, wherein the two sealing blocks are manufactured from plastic.

5. The support of claim 1, wherein each of the two sealing blocks is connected non-positively to the heat sink by a screw connection.

6. The support of claim 1, wherein the bead extends orthogonal to the lateral walls.

7. The support of claim 1, wherein the sealing apparatus has an adhesive connection with the heat sink surface and/or with the at least one of the two sealing blocks.

8. The support of claim 1, wherein the support structure includes a ceramic substrate coated with a copper structure remote to the heat sink surface.

9. A support for at least one electrical component, said support comprising:
- a heat sink including a heat sink surface and two opposing lateral walls protruding from the heat sink surface, said heat sink including a base body made of aluminum and a copper layer as a heat spreading layer which forms the heat sink surface, with the copper layer being produced together with the base body through continuous casting, or with the copper layer being applied additively through cold gas spraying to a surface of the base body;
- two spaced-apart sealing blocks lying on the heat sink surface, each of the two sealing blocks extending between the two lateral walls and contacting the two lateral walls;
- a support structure arranged on the heat sink surface between the two sealing blocks;
- connection contacts arranged on the support structure and protruding from the support structure remote to the heat sink surface; and
- a cover detachably connected to the heat sink and having cover openings for passage of the connection contacts in order to stabilize the connection contacts.

10. The support of claim 9, wherein the cover is connectable to the heat sink via a latching connection or a screw connection.

11. An electronics module, comprising:
- a support comprising a heat sink including a heat sink surface and two opposing lateral walls protruding from the heat sink surface, said heat sink including a base body made of aluminum and a copper layer as a heat spreading layer which forms the heat sink surface, with the copper layer being produced together with the base body through continuous casting, or with the copper layer being applied additively through cold gas spraying to a surface of the base body, two spaced-apart sealing blocks lying on the heat sink surface, each of the two sealing blocks extending between the two lateral walls and contacting the two lateral walls and at least one of the two sealing blocks including a bead on a side facing the heat sink surface, a sealing apparatus arranged in the bead, and a support structure arranged on the heat sink surface between the two sealing blocks;
- an electrical component arranged on the support structure of the support; and
- a casting compound covering the support structure and the electrical component.

12. The electronics module of claim 11, wherein the casting compound is a silicon-based soft casting compound.

13. The electronics module of claim 11, wherein the electrical component is a power semiconductor component.

14. The electronics module of claim 11, wherein the power semiconductor component is a bipolar transistor with an insulated gate electrode.

15. The electronics module of claim 11, further comprising a cooling beam having recesses for receiving cooling fins of the heat sink, with the heat sink connected via the cooling fins to the recesses of the cooling beam.

16. An electronics module, comprising:
- a support comprising a heat sink including a heat sink surface and two opposing lateral walls protruding from the heat sink surface, said heat sink including a base body made of aluminum and a copper layer as a heat spreading layer which forms the heat sink surface, with the copper layer being produced together with the base body through continuous casting, or with the copper layer being applied additively through cold gas spraying to a surface of the base body, two spaced-apart sealing blocks lying on the heat sink surface, each of the two sealing blocks extending between the two lateral walls and contacting the two lateral walls, a support structure arranged on the heat sink surface between the two sealing blocks, connection contacts arranged on the support structure and protruding from the support structure remote to the heat sink surface, and a cover detachably connected to the heat sink and having cover openings for passage of the connection contacts in order to stabilize the connection contacts;
- an electrical component arranged on the support structure of the support; and
- a casting compound covering the support structure and the electrical component.

17. The electronics module of claim 16, wherein the casting compound is a silicon-based soft casting compound.

18. The electronics module of claim 16, wherein the electrical component is a power semiconductor component.

* * * * *